(12) United States Patent
Hausperger et al.

(10) Patent No.: US 7,541,799 B2
(45) Date of Patent: Jun. 2, 2009

(54) METHOD AND DEVICE FOR MEASURING A CURRENT FLOWING IN AN ELECTRICAL CONDUCTOR

(75) Inventors: Christian Hausperger, Bonbruck (DE); Edgar Kindler, Landshut (DE); Ricardo Erckert, Bad Aibling (DE); Bernhard Rollgen, Munich (DE)

(73) Assignees: Lisa Dräxlmaier GmbH, Vilsbiburg (DE); EPCOS AG, Münech (DE)

(*) Notice: Subject to any disclaimer, the term of this patent is extended or adjusted under 35 U.S.C. 154(b) by 210 days.

(21) Appl. No.: 11/441,280

(22) Filed: May 25, 2006

(65) Prior Publication Data

US 2006/0290341 A1    Dec. 28, 2006

(30) Foreign Application Priority Data

May 25, 2005    (DE)    .................. 10 2005 024 075

(51) Int. Cl.
G01R 15/20 (2006.01)
G01R 33/07 (2006.01)
G01R 15/18 (2006.01)
G01R 19/20 (2006.01)

(52) U.S. Cl. .......................... 324/117 H; 324/117 R
(58) Field of Classification Search ............. 324/117 H
See application file for complete search history.

(56) References Cited

U.S. PATENT DOCUMENTS

| | | | | |
|---|---|---|---|---|
| 3,482,163 A | | 12/1969 | Peek et al. | |
| 3,974,425 A | | 8/1976 | Ueda et al. | |
| 4,059,798 A | | 11/1977 | Dierker et al. | |
| 4,675,255 A | * | 6/1987 | Pfeifer et al. | 429/92 |
| 4,939,448 A | | 7/1990 | Gudel | |
| 4,947,108 A | | 8/1990 | Gudel | |
| 5,091,697 A | * | 2/1992 | Roth et al. | 324/253 |
| 5,168,223 A | * | 12/1992 | Le Thiec | 324/253 |
| 5,446,435 A | | 8/1995 | Etter | |
| 5,457,873 A | | 10/1995 | Cattaneo | |
| 5,475,301 A | | 12/1995 | Kawakami et al. | |
| 5,552,700 A | * | 9/1996 | Tanabe et al. | 324/117 H |
| 5,831,424 A | * | 11/1998 | Jensen | 324/117 R |
| 6,005,383 A | | 12/1999 | Savary | |

(Continued)

FOREIGN PATENT DOCUMENTS

DE    1 209 198 B    11/1963

(Continued)

OTHER PUBLICATIONS

European Search Report 06010079.9 dated Sep. 1, 2006.

*Primary Examiner*—Ha Tran T Nguyen
*Assistant Examiner*—Roberto Velez
(74) *Attorney, Agent, or Firm*—Wolf, Greenfield & Sacks, P.C.

(57) ABSTRACT

A device for measuring a current flowing in an electrical conductor having a sensor disposed in the region of the electrical conductor for measuring the magnetic field surrounding the electrical conductor. The sensor includes a magnetic circuit having a first and a second section. A magnetizing device for the saturation of the second section and an evaluation device for calculating the current flowing through the electrical conductor in dependence on measured values $B(P0)$, $B(P1)$, $B(P2)$, $B(P4)$, $B(P4+)$, $B(P4-)$ of the magnetic field surrounding the electrical conductor and in dependence on the applicable magnetization of the second section is also provided. A method for operating the device is also disclosed.

25 Claims, 5 Drawing Sheets

U.S. PATENT DOCUMENTS

| | | |
|---|---|---|
| 6,548,998 B1 | 4/2003 | Gudel |
| 6,788,046 B2 | 9/2004 | Lenhard et al. |
| 2004/0145373 A1 * | 7/2004 | Knecht .................. 324/522 |

FOREIGN PATENT DOCUMENTS

| | | |
|---|---|---|
| DE | 25 06 918 C3 | 9/1975 |
| DE | 27 06 547 C3 | 9/1977 |
| DE | 38 35 101 A1 | 5/1989 |
| DE | 39 05 060 C2 | 8/1990 |
| DE | 42 29 065 A1 | 3/1994 |
| DE | 42 29 948 A1 | 3/1994 |
| DE | 199 10 411 C2 | 9/2000 |
| DE | 101 05 186 A1 | 8/2002 |
| EP | 0 499 589 B1 | 1/1996 |
| EP | 0 558 702 B1 | 1/1996 |
| EP | 0 558 702 B1 | 5/1996 |
| EP | 0 584 295 B1 | 10/1997 |
| EP | 0 815 456 B1 | 1/1998 |
| EP | 0 815 456 B1 | 9/1999 |
| EP | 1 250 605 B1 | 3/2004 |
| EP | 1 084 417 B1 | 4/2004 |
| GB | 1 478 225 | 6/1977 |
| GB | 1 478 225 A | 6/1977 |
| GB | 2 228 337 A | 2/1989 |
| GB | 2 228 337 A | 8/1990 |
| JP | 01281715 A | 11/1989 |
| JP | 03170873 A | 7/1991 |
| WO | WO 00/54068 A1 | 9/2000 |
| WO | WO 01/40811 A2 | 6/2001 |
| WO | WO 2004/006373 A2 | 7/2004 |
| WO | WO 2004/063738 A2 | 7/2004 |
| WO | WO 2005/005998 A1 | 1/2005 |

* cited by examiner

METHOD AND DEVICE FOR MEASURING A CURRENT FLOWING IN AN ELECTRICAL CONDUCTOR

BACKGROUND

1. Field

Aspects of the invention relate to a method and a device for measuring a current flowing in an electrical conductor.

2. Discussion of Related Art

In the automotive field, the increasing number of power consuming devices is placing a constantly growing energy demand on the vehicle electrical system. In particular, this increased energy demand places increasing loads on a vehicle's battery, which serves as a buffer during the operation of the vehicle's engine and maintains the vehicle's power supply when the engine is off. When the vehicle is frequently used for short-distance trips, the result may be that the battery is not fully charged while the engine is on. This can result in the vehicle being left with a discharged battery or being difficult if not impossible to start because the battery voltage is too low. This situation may be compounded in motor vehicles that place such a high energy demand on the vehicle's electrical system.

To reduce these and other effects, energy management systems are increasingly being used in vehicles. An energy management system typically is used to ensure that the battery's charge state does not enter a critical condition and maintain a positive battery charge balance. Such a system analyzes the battery condition based on measured variables such as 'battery current', 'battery voltage' and 'battery temperature'. Particular importance is placed on the determination of the battery charge current or discharge current in order to keep the battery at a non-critical charge level and to ensure that the vehicle is able to start.

To determine the charge current or discharge current, the system must measure currents over a very wide range, for example from −200 A to 1500 A. Therefore, a suitable sensor for the energy management system in vehicles has to cover this wide range, that is, it must have a high dynamic response.

A prior art sensor system for use in a motor vehicle for monitoring the flowing currents is shown schematically in FIGS. 9 and 10. To determine the battery current, a measuring resistor 202 is inserted in the ground lead 201. Suitable evaluation electronics 203 directly measure the voltage drop at the measuring resistor and calculate the flowing current. The measuring resistor can, for example, be made of manganin.

FIG. 9 is a schematic representation of the measuring arrangement utilizing this sensor. An automotive battery 205 is connected by a ground lead 201 to the vehicle ground. The sensor, comprising the measuring resistor 202 and the evaluation electronics 203, is integrated in the ground lead 201. Electrical power consuming devices 206 in the motor vehicle are connected to the positive pole of the battery 205 via a line 207.

One drawback of this prior art arrangement stems from the fact that the measuring resistor has to be integrated in the current-carrying conductor. This arrangement involves additional design costs because it is necessary to ensure that shear and tensile forces are kept away from the measuring resistor. Deformation of the measuring resistor can influence the result of the measurement and, in extreme cases, results in a defective sensor. A further drawback is the fact that power loss dissipation necessarily occurs across the measuring resistor. Even when small resistors are used, for example a 100 µΩ measuring resistor, heat is still is generated and must be dissipated.

SUMMARY

In one illustrative embodiment, a method for measuring a current flowing in an electrical conductor with a sensor disposed in the region of the electrical conductor for measuring a magnetic field surrounding the electrical conductor is provided. The sensor has a magnetic circuit having a first and a second section and a magnetizing device for magnetic saturation of the second section. The method includes measuring a magnetic field in each case after switching off both a positive and a negative saturation of the second section to obtain measured values B(P1) and B(P2), and calculating a mean value B(P0) of the measured values B(P1), B(P2); measuring the magnetic field with both positive and negative saturation of the second section to obtain measured values B(P4+) and B(P4−), and calculating a mean value B(P4) of the measured values B(P4+), B(P4−); and calculating a current flowing through the electrical conductor by subtracting the mean value B(P4) from the mean value B(P0) and multiplying a resulting difference by a constant.

In another illustrative embodiment, a device for measuring a current flowing in an electrical conductor is provided. The device includes a sensor disposed in the region of the electrical conductor for measuring a magnetic field surrounding the electrical conductor. The sensor has a magnetic circuit having a first and a second section, a magnetizing device for saturating the second section, and an evaluation device for calculating the current flowing through the electrical conductor in dependence on measured values B(P0), B(P1), B(P2), B(P4), B(P4+), B(P4−) for the magnetic field surrounding the electrical conductor magnetic field and in dependence on the applicable magnetization of the second section.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labelled in every drawing. Various embodiments of the invention will now be described, by way of example, with reference to the accompanying drawings, in which.

DETAILED DESCRIPTION

Figure 1:
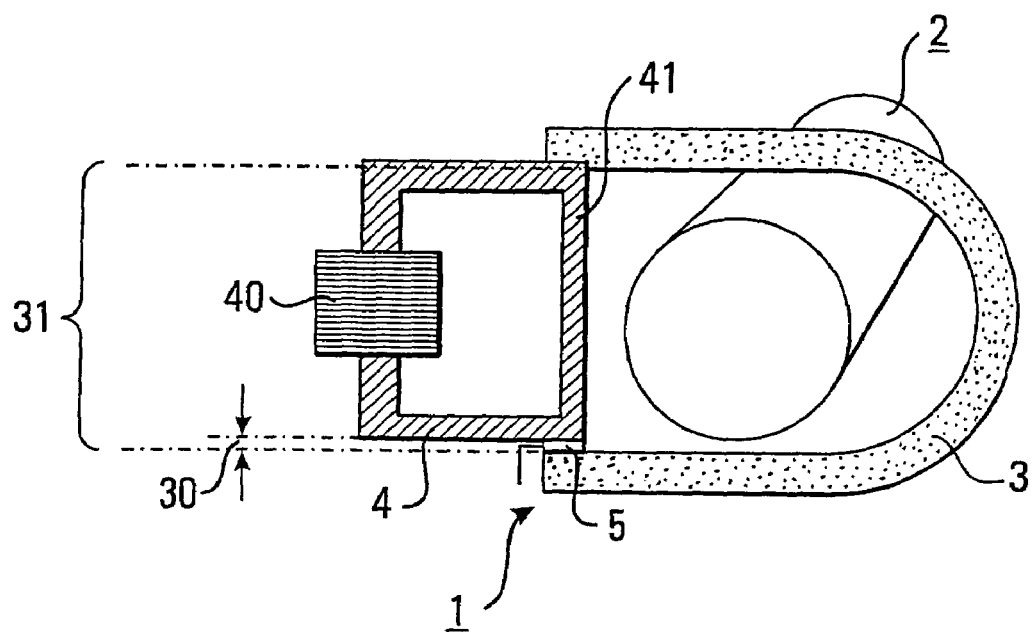
FIG. 1 is a schematic representation of a current sensor according to one embodiment.

A sensor system and method are employed to measure current flow in an electrical conductor. In one embodiment, a sensor disposed in the region of the electrical conductor is used to measure the magnetic field surrounding the electrical conductor. In one embodiment, the sensor comprises a magnetic circuit having a first and a second section. A magnetising device may be provided for the magnetic saturation of the second section.

In one embodiment, the sensor has a switching measuring range, which is explained in further detail below. The switching measuring range provides a wide measuring range, that is, a high dynamic response from the sensor. However, this high dynamic response may be accompanied by system-inherent measuring errors resulting from a possible hysteresis of the second section and a possible temperature drift of individual components.

According to one aspect of the invention, a methodology for permitting a measurement that reduces and/or eliminates these measuring errors will now be described. In a first step, the magnetic field is measured in each case after switching off both a positive and a negative saturation of the second section and then the mean value of the measured values is calculated. In a second step, the magnetic field is measured with both positive and negative saturation of the second section and then the mean value of the measured values is calculated. After the determination of the two mean values, the current flowing through the electrical conductor is calculated by subtracting the mean value calculated in the second step from the mean value calculated in the first step and the result multiplied by a constant. It should be appreciated that the present invention is not limited in this respect, as the process steps can be performed in any suitable order. For example, the sequence of the first and second step can be reversed.

By employing this method, the current can be measured in a wide measuring range with a potential-free sensor and any system-inherent measuring errors that may occur can be reduced or eliminated.

In one embodiment, the constant is selected to take into account the sensitivity of the sensor with both a saturated and an unsaturated second section. This may be beneficial as it will allow the current flowing through the conductor to be defined directly from the measured values determined.

It should be appreciated that other suitable methods may be employed, as the present invention is not limited in this regard. In another embodiment, in a first step, the second section is positively saturated and the magnetic field measured. In a second step, the saturation is switched off and the magnetic field is measured again. In a third step, the second section is negatively saturated and then the magnetic field is measured. In a fourth step, the magnetic field is measured after switching off the saturation. The mean value of the values measured in the second and fourth steps is then determined in a fifth step and the mean value of the values measured in the first and third step is determined in a sixth step. The current flowing through the conductor is calculated by subtracting the mean values from one another, for example, by subtracting the mean value calculated in the sixth step from the mean value calculated in the fifth step and then multiplying with a constant taking account of the sensitivity of the sensor with both a saturated and an unsaturated second section. Employing this method may reduce the time required to determine the required measured values.

For monitoring a vehicle electrical system, all or portions of the process can be performed repeatedly in order to determine current flow over time.

The method may be preformed using any suitable device and/or system. In one embodiment, the method is performed automatically with an evaluation device. In one embodiment, this evaluation device only displays the value determined for the current and/or makes it available. In this regard, the evaluation device may automatically control the measuring process, and in one embodiment, controls the switching on and off of the magnetizing device.

The method described can be implemented in a vehicle, in particular in a motor vehicle. In one embodiment, the method may be used to monitor the battery current in a vehicle or for monitoring individual electric energy consumers or consumer groups.

Depending upon the materials used for the first and second sections of the magnetic circuit, the first section comprises a first saturation magnetization and the second section comprises a second saturation magnetization, whereby the first saturation magnetization is smaller than, equal to or greater than the second saturation magnetization. In this way, the parameters of the sensor may be set by selecting the applicable combination of saturation magnetizations.

In one embodiment, for measuring a current flowing in an electrical conductor comprises a sensor disposed in the region of the electrical conductor so as to measure the magnetic field surrounding the electrical conductor. In this regard, the sensor comprises a magnetic circuit having a first and a second section and a magnetizing device is provided for the saturation of the second section. An evaluation device for calculating the current flowing through the electrical conductor in dependence on the measured values for the magnetic field surrounding the electrical conductor and in dependence on the applicable magnetization of the second section is also provided.

The device may be used to perform a current measurement over a wide range thereby permitting a reliable measurement without the influence or with reduced influence of system-inherent measuring errors.

In one embodiment of the device, the magnetic circuit comprises an air gap and a magnetic-field-sensitive component disposed in the air gap for measuring the magnetic field surrounding the electrical conductor. In one embodiment, the component is a Hall sensor.

To achieve an accurate acquisition of the magnetic field surrounding the electrical conductor, in one embodiment, the magnetic circuit substantially encompasses the electrical conductor.

A simple application of the device is achieved in one embodiment whereby the evaluation device includes an arrangement to automatically perform the method. In one embodiment, this also includes an arrangement for controlling the magnetizing device.

The integration of the evaluation device with the sensor results in a compact design. In another embodiment, the spatial separation of the evaluation device and the sensor results in a highly flexible system.

In a second embodiment of the sensor, the first section of the magnetic circuit has at least two legs, which overlap each other and form an air gap in the region of the overlap. In this regard, the legs may have a generally arched shape in order to permit the bridging of a conductor.

In the second embodiment of the sensor, the second section can also be embodied as a rectangular ferrite core frame bearing a control winding on at least one side. The ferrite core frame can bear a control winding on each long side of the rectangular ferrite core frame to achieve a symmetrical design.

In one embodiment, when used to monitor a vehicle electrical system, the sensor can be disposed in the region of a ground conductor or a positive conductor of a vehicle battery, in particular a motor vehicle battery, or in the region of an electrical consumer or a group of electrical consumers in a vehicle.

The method and device described herein can be used in a motor vehicle for monitoring currents in the vehicle electrical system.

Turning now to the figures, embodiments of the present invention will now be described.

FIG. 1 is a schematic view of a first embodiment of a sensor used in the device for measuring a magnetic field surrounding the electrical conductor, which can also be used for the performance of the method.

The sensor 1 is used for measuring the magnetic field surrounding the electrical conductor 2 when a current flows through the conductor. For this, the sensor 1 comprises a magnetic circuit substantially surrounding the electrical conductor 2. In one embodiment, the magnetic circuit comprises a first, substantially U-shaped section 3 made of an amorphous material with a high saturation magnetization. The magnetic circuit is closed on the open side of the first section 3 by a second section 41 of the magnetic circuit. The second section 41 is spaced to provide air gap 30. The second section of the magnetic circuit is part of a closed, frame-shaped ferrite core 4 having a lower saturation magnetization than the first section.

The air gap 30 formed between one leg of the U-shaped first section 3 and the end of the second section 41 is completely filled by a Hall sensor 5. The Hall sensor is used for measuring the magnetic field surrounding the electrical conductor. The leg of the ferrite core 4 facing the second section 41 bears a control winding 40 with which the ferrite core can be saturated.

To use the sensor 1 over the widest possible measuring range, that is with the highest possible dynamic response, the sensor is operated as follows:

At low currents, the sensor is operated with higher sensitivity. For this, the ferrite core 4 is operated unsaturated, the control winding 40 is therefore currentless. The magnetic circuit then comprises the first section 3 and the second section 41. Only the small air gap 30, which is filled with the Hall sensor 5, is provided in this regard. This enables small magnetic fields to be measured at current intensities of up to approximately 20 A.

To measure high currents, the ferrite core 4 is operated by applying a magnetic field by means of the saturated control winding 40. This means the ferrite core 4, and hence also the second section 41 of the magnetic circuit, is no longer effective for the magnetic circuit. The air gap of the magnetic circuit is therefore enlarged by the leg length of the second section 41. The field fixed in the magnetic circuit is attenuated by the now large air gap 31 so that the sensitivity of the sensor 1 is reduced and high currents can be detected with the Hall sensor 5.

Figure 2:
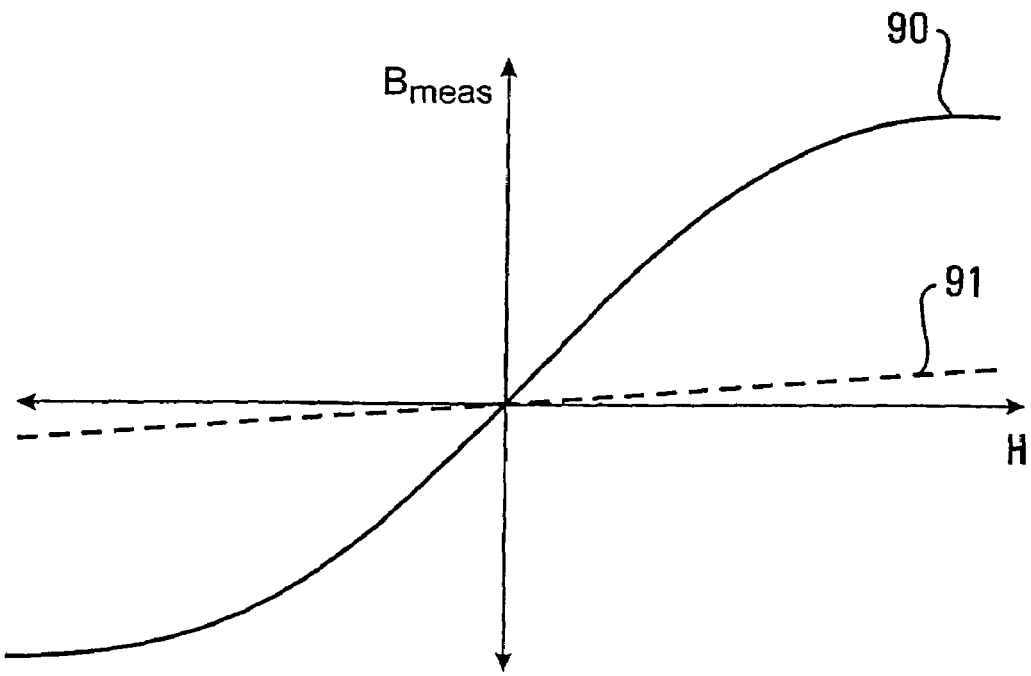
FIG. 2 is a schematic representation of saturation curves.

FIG. 2 shows an example of measured curves to illustrate the relationship. Here, plotted on the X-axis is the magnetic field H surrounding the electrical conductor—this field is also fixed in the magnetic circuit and is determined by the current $I_{DC}$ flowing through the electrical conductor. Plotted on the Y-axis is the magnetic field B measured by the Hall sensor. In this regard, the continuous measured curve 90 shows the relationship when the control winding 40 is switched off, that is, with a small air gap. Here, high sensitivity is observed.

The dotted line 91 shows the relationship when the control winding 40 is switched on, that is, with a large air gap. Here, a low measuring sensor sensitivity is observed.

The sensor 1 described above can be used to measure current flowing in an electrical conductor according to the following exemplary methodology.

When using the sensor described, it should be noted that the hysteresis of the ferrite core 4 can lead to an error in the result of the measurement. It should also be noted that a temperature drift of the Hall sensor and a long-term drift of the other components from which the sensor is assembled can also result in a false measuring signal. These two possible causes of errors can cause a zero offset, that is, the measuring curves no longer pass through the origin of the H/B coordinate system. These possible errors may be corrected, inter alia, by the method described below.

Figure 3:
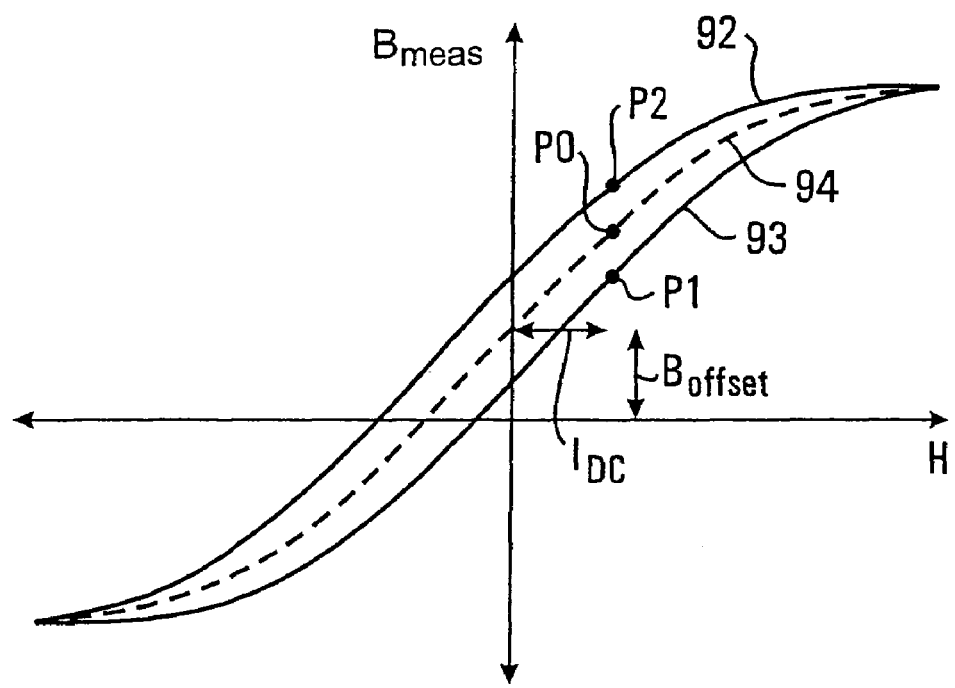
FIG. 3 is a schematic representation of the determination of measuring points in a first step.

In the following it is assumed that a constant current $I_{DC}$ flows through the electrical conductor. As FIG. 3 shows, to correct the influence of the hysteresis curve of the ferrite core 4, the B-field (magnetic field) is measured at points P1 and P2. For this, the ferrite core 4 is positively saturated by the appropriate excitation of the control coil 40. When the control coil 40 is switched off, the measuring point B(P2) is obtained. After this, appropriate energization of the control coil 40 causes the ferrite core 4 to be negatively saturated, then the control coil is switched off and the measuring point B(P1) measured. Simple averaging is used to obtain the mean B(P0) of the two measuring points B(P1) and B(P2). The mean B(P0) then lies on the 'ideal' magnetization curve 94 of the ferrite core.

The point B(P1) lies on the lower branch 93 of the hysteresis curve, while the measuring point B(P2) lies on the upper branch 92 of the hysteresis curve. As FIG. 3 shows, the ideal magnetization curve 94 is still offset by an offset $B_{Offset}$ caused by temperature effects or by a general component drift.

The mean B(P0) can be described by the following formula:

$$B(P0)=S_{unsat}*I_{DC}+B_{Offset}$$

where $S_{unsat}$ is the sensitivity of the sensor when the ferrite core 4 is unsaturated, that is, when a small air gap 30 is provided.

Figure 4:
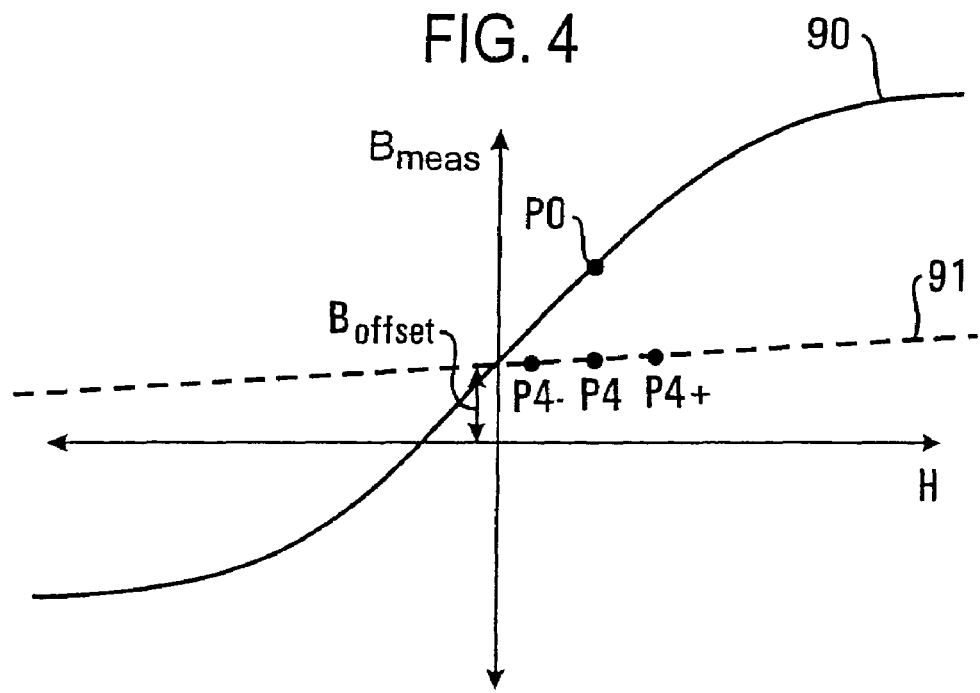
FIG. 4 is a schematic representation of the determination of measuring points in a second step.

The offset errors shown in FIG. 3 can be corrected by determining another point. The determination of this other point B(P4) is explained with reference to FIG. 4. In FIG. 4, the continuous curve 90 is again the curve for a small air gap, that is, high sensor sensitivity, and the curve 91, which is shown as a dotted line, is the curve for a large air gap, that is, low sensor sensitivity.

The measuring points B(P4+) and B(P4−) are now measured while the ferrite core 4 is operated saturated, that is, the sensor is operated with low sensitivity. The measuring point B(P4+) is established when the ferrite core 4 is positively saturated by the appropriate excitation of the control coil 40 while the measuring point B(P4−) is established with adequate negative saturation of the ferrite core 4. With this measurement, it should be noted that the magnetization of the ferrite core 4 gives rise to a positive or negative stray field which falsifies the measuring results in question. The subsequent averaging of the measured values B(P4+) and B(P4−) cancels out the influence of this stray field.

This mean value B(P4) is also offset by an error $B_{Offset}$. B(P4) can be expressed by the following formula:

$$B(P4)=S_{sat}*I_{DC}+B_{Offset}$$

where $S_{sat}$ is the sensitivity of the sensor when the ferrite core 4 is saturated, that is, when a large air gap 31 is provided.

The two mean values B(P0) and B(P4) calculated are now both affected by the offset error $B_{offset}$. The subtraction of the calculated values B(P0)–B(P4) eliminates this offset error $B_{offset}$. The result obtained from this is then free of the effects of errors. The calculation is performed as follows:

$$B(P0)-B(P4)=(S_{unsat}-S_{sat})*I_{DC}$$

If $K=S_{sat}/S_{unsat}$ then $$B(P0)-B(P4)=S_{unsat}*(1-K)*I_{DC}.$$

The current can now be calculated as follows:

$$I_{DC}=(B(P0)-B(P4))/(S_{unsat}*(1-K))$$

This method makes it possible to use the above-described sensor to measure currents in a wide measuring range without errors. The potential-free current measurement described, which is performed without the incorporation of a measuring resistor in the current-carrying leads in question, eliminates or reduces the impact of power loss.

Figure 5:
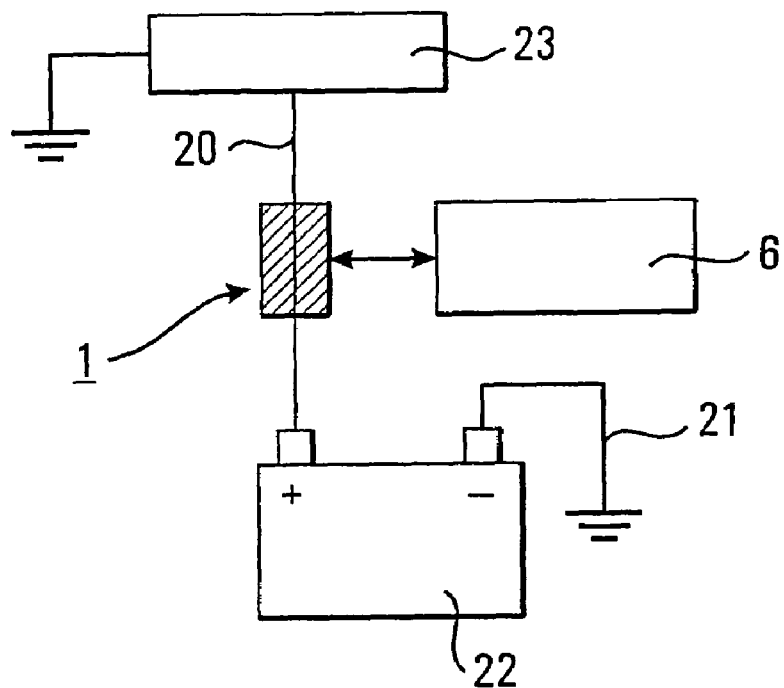
FIG. 5 is a schematic representation of the sensor in a vehicle electrical system of a motor vehicle according to one embodiment.

Turning now to FIG. 5, the device comprising the sensor 1 and the evaluation device 6 will now be described. The evaluation device 6 is designed so that it is able to process measured values from the Hall sensor 5 and data on the applicable control voltage of the control coil 40 to calculate the current flowing through the electrical conductor. In this regard, in one embodiment, the evaluation device 6 can also control the method, that is, cause the control coil 40 to be energized and record, store and/or process the measured values at the appropriate time. For this, the evaluation device 6 can comprise an interface (not shown in the diagrams) connected to an amplifier, for energizing the control coil 40, and to the Hall probe 5. In addition, data storage devices are used to store the measured data. In a one embodiment, the amplifier can also be integrated with the evaluation device, although the present invention is not limited in this regard.

As shown in FIG. 5, in one embodiment, the combination of sensor 1 and the evaluation device 6 is incorporated in the positive line 20 leading to an electrical energy consuming device 23 (consumer 23) in a vehicle. The positive line 20 leads from a battery 22 to the electrical consumer 23. The ground lead 21 is connected to the ground lead of the vehicle. In this regard, the sensor 1 is disposed directly after the positive pole of the battery 22. This is also known as a 'high-side' sensor disposal.

Figure 6:
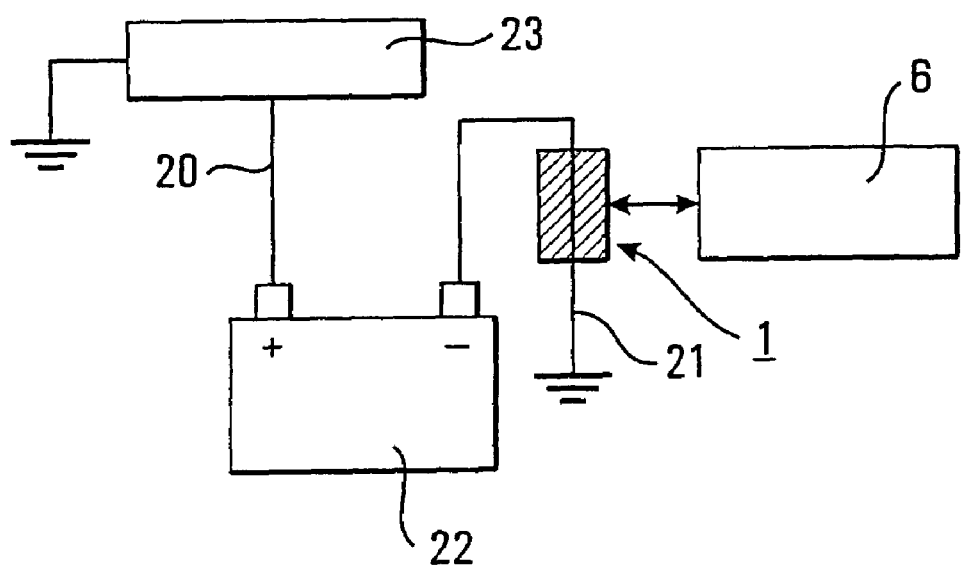
FIG. 6 is a schematic representation of the sensor in a vehicle electrical system of a motor vehicle according to another embodiment.

FIG. 6 shows the corresponding disposal of the sensor 1 in the ground lead 21 of the applicable vehicle electrical circuit. This is also known as a 'low-side' disposal of the sensor.

It is possible to integrate the sensor 1 with the evaluation device 6 to form one component, as the present invention is not limited to employing separate components. For example, if integration is not desirable due to the cramped conditions in the engine compartment, the evaluation device 6 can also be disposed separately from the sensor 1.

Figure 7:
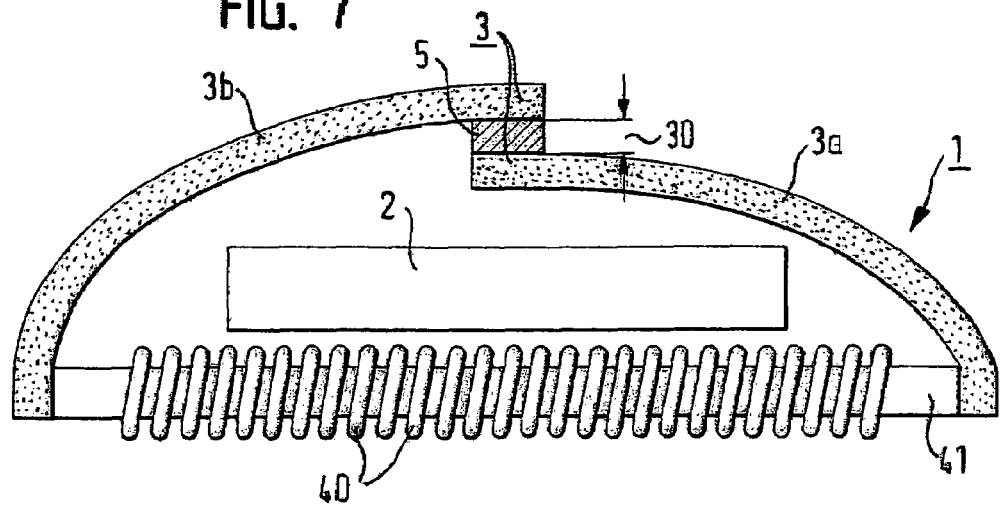
FIG. 7 is a schematic side view of a current sensor according to a second embodiment.
Figure 8:
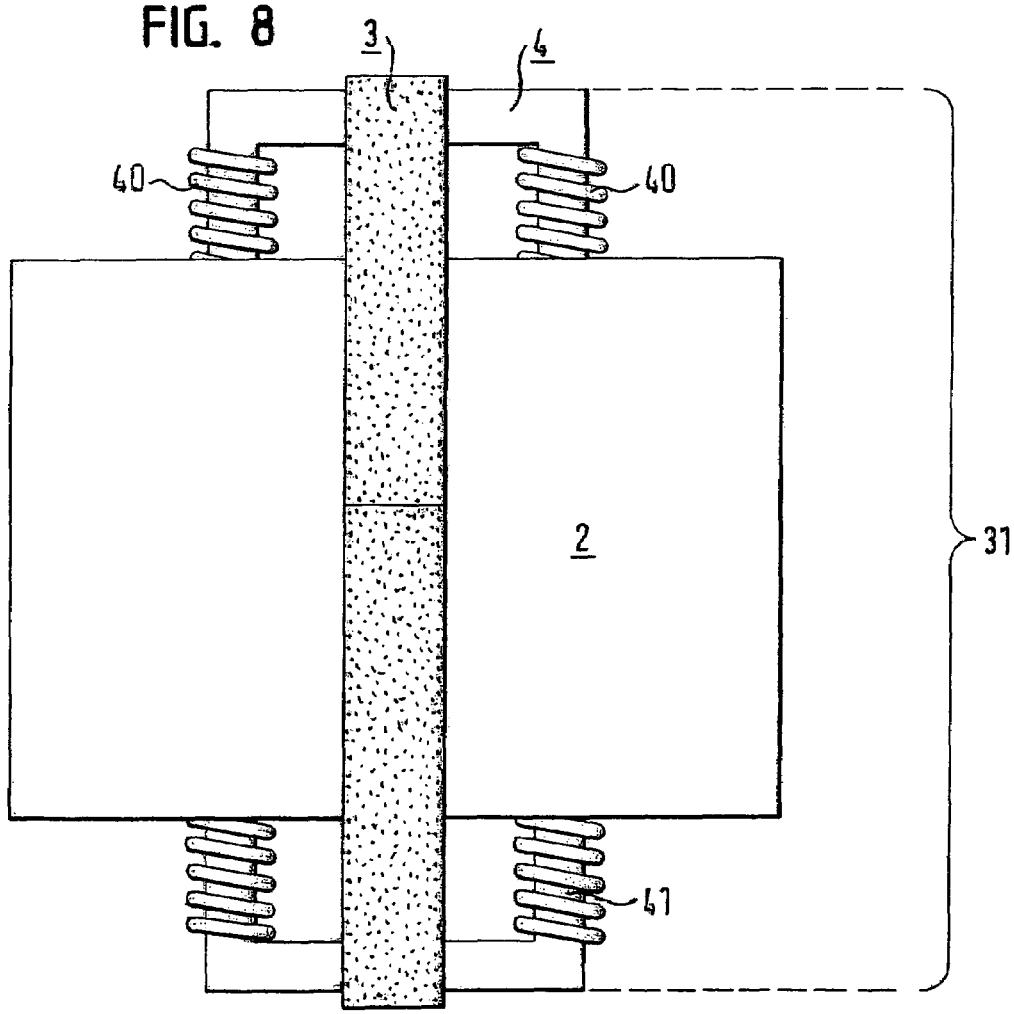
FIG. 8 is a schematic top view of the current sensor of FIG. 7.
Figure 9:
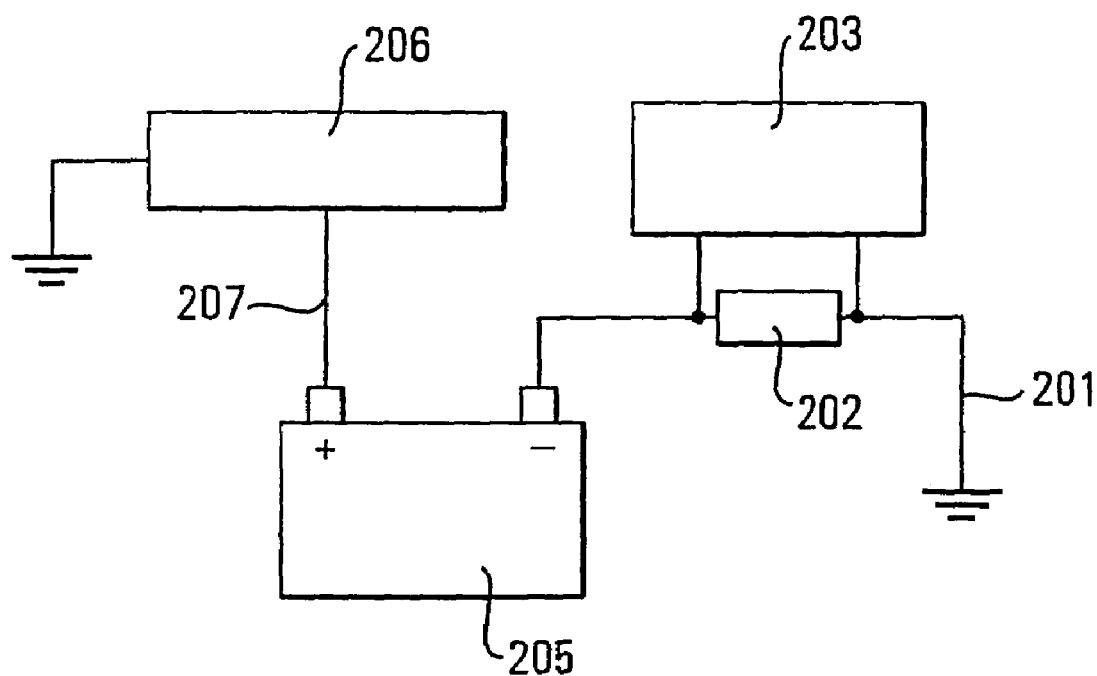
FIG. 9 is a schematic representation of a prior art sensor system.
Figure 10:
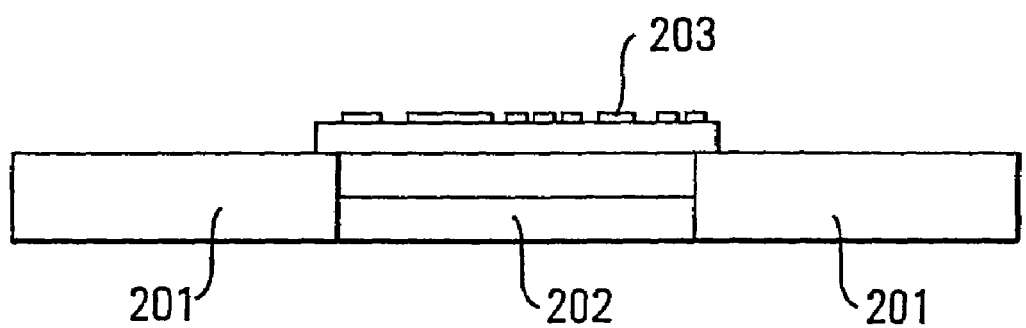
FIG. 10 is a sectional representation of the prior art sensor system.

FIG. 7 and FIG. 8 show a second embodiment of a current sensor 1 with which the method can be performed and which can be provided in the device, whereby FIG. 7 shows a side view of the sensor and FIG. 8 a top view of the sensor.

A flat electrical conductor 2, for example a flat ribbon conductor, a sheet conductor or a conductor provided on a printed circuit board, is surrounded by the sensor 1. The sensor 1 comprises a magnetic circuit comprising a first section 3, which is here formed by a first leg 3a and a second leg 3b, and a second section 41. The legs 3a and 3b of the first section 3 overlap each other in the middle region of this section but are separated from each other by an air gap 30. To enable a conductor to be bridged, the legs 3a, 3b have an arched shape and together form a semi-arch. Hall sensor 5, which is used to measure the flow present in the magnetic circuit, is inserted in the air gap 30.

As can be seen in the top view, the second section is embodied as a rectangular ferrite core frame 4. In region 41, a magnetizing device in the form of control windings 40, each of which are applied to the long sides of the rectangular ferrite core frame 4, is provided. The lower legs of the first section are connected to this rectangular ferrite frame 4 in the middle region of the short sides of the rectangular ferrite frame 4.

To measure low currents, the control windings 40 remain currentless. To measure high currents, the ferrite core frame 4 is operated by applying a magnetic field by means of the saturated control windings 40. This means the ferrite core frame 4, and hence also the second section 41 of the magnetic circuit, is no longer effective for the magnetic circuit. The magnetic circuit's air gap is therefore increased by the leg length of the second section 41. The field fixed in the magnetic circuit is attenuated by the additional large air gap 31 so that the sensitivity of the sensor 1 is reduced and the Hall sensor 5 can detect high currents. With this second embodiment of the sensor, the total air gap is the sum of the air gap 30 of the first section 3 of the magnetic circuit and of the air gap 31 of the second section 41 of the magnetic circuit.

The device and the method can be used not only for monitoring the complete vehicle electrical system, but also to measure current values for individual electrical consumers or individual consumer groups. The use of the sensor is in all cases independent of the voltage applied. Since this also involves a potential-free measurement, use with high voltages is also possible. Therefore, the universal application of the device for measuring the current is possible. In particular, use in vehicles with a higher vehicle supply voltage, for example in vehicles with a hybrid drive is possible.

Having thus described several aspects of at least one embodiment of this invention, it is to be appreciated various alterations, modifications, and improvements will readily occur to those skilled in the art. Such alterations, modification, and improvements are intended to be part of this disclosure, and are intended to be within the spirit and scope of the invention. Accordingly, the foregoing description and drawings are by way of example only.

What is claimed is:

1. A method for measuring a current flowing in an electrical conductor with a sensor disposed in the region of the electrical conductor for measuring a magnetic field surrounding the electrical conductor, whereby the sensor comprises a magnetic circuit having a first and a second section and a magnetizing device for magnetic saturation of the second section, the method comprising:

measuring the magnetic field after switching off a positive saturation of the second section to define a first measured magnetic field value B(P1);

measuring the magnetic field after switching off a negative saturation of the second section to define a second measured magnetic field value B(P2);

calculating a first mean switched off magnetic field value B(P0) by averaging the first measured magnetic field value B(P1) and the second measured magnetic field value B(P2);

measuring the magnetic field after switching on a positive saturation of the second section to define a fourth measured magnetic field value B(P4+);

measuring the magnetic field after switching on a negative saturation of the second section to define a fifth measured magnetic field value B(P4−);

calculating a second mean switched on magnetic field value B(P4) by averaging the fourth measured magnetic field value B(P4+) and the fifth measured magnetic field value B(P4−); and calculating a current flowing through the electrical conductor by subtracting the second mean switched on magnetic field value B(P4) from the first mean switched off magnetic field value B(P0) and multiplying a resulting difference by a constant.

2. The method according to claim 1, wherein the constant takes account of a sensitivity of a sensor with both a saturated and an unsaturated second section.

3. The method according to claim 1, wherein the steps of the method are performed repeatedly.

4. The method according to claim 1, wherein all the steps are performed automatically in an evaluation device.

5. The method according to claim 4, wherein the evaluation device provides the value determined for the current flowing through the electrical conductor.

6. The method according to claim 4, wherein the evaluation device automatically controls the switching on and off of the magnetizing device.

7. The method according to claim 1, wherein the method is performed in a motor vehicle.

8. The method according to claim 7, wherein the method is used to monitor the battery current of the vehicle or for monitoring individual consumers or consumer groups in the vehicle.

9. The method according to claim 1, wherein the first section comprises a first saturation magnetization and the second section comprises a second saturation magnetization and the first saturation magnetization is different from the second saturation magnetization.

10. A device for measuring a current flowing in an electrical conductor comprising:
a sensor disposed in the region of the electrical conductor for measuring a magnetic field surrounding the electrical conductor, the sensor comprising:
a magnetic circuit having a first and a second section;
a magnetizing device for saturating the second section; and
an evaluation device for calculating the current flowing through the electrical conductor, wherein the evaluation device operatively:
measures the magnetic field to define a first measured magnetic field value B(P1) after switching off a positive saturation of the second section;
measures the magnetic field to define a second measured magnetic field value B(P2) after switching off a negative saturation of the second section;
calculates a first mean switched off magnetic field value B(P0) by averaging the first measured magnetic field value B(P1) and the second measured magnetic field value B(P2);

measures the magnetic field to define a fourth measured magnetic field value B(P4+) after switching on a positive saturation of the second section;

measures the magnetic field to define a fifth measured magnetic field value B(P4−) after switching on a negative saturation of the second section;

calculates a second mean switched on magnetic field value B(P4) by averaging the fourth measured magnetic field value B(P4+) and the fifth measured magnetic field value B(P4−); and calculates a current flowing through the electrical conductor by subtracting the second mean switched on magnetic field value B(P4) from the first mean switched off magnetic field value B(P0) and multiplying a resulting difference by a constant.

11. The device according to claim 10, wherein the magnetic circuit comprises an air gap and a magnetic-field-sensitive component disposed in the air gap for measuring the magnetic field surrounding the electrical conductor.

12. The device according to claim 11, wherein the magnetic-field-sensitive component is a Hall sensor.

13. The device according to claim 10, wherein the magnetic circuit substantially encompasses the electrical conductor.

14. The device according to claim 10, wherein the evaluation device controls the magnetizing device.

15. The device according to claim 10, wherein the evaluation device is integrated with the sensor.

16. The device according to claim 10, wherein the evaluation device and the sensor are separate from each other.

17. The device according to claim 10, wherein the sensor is disposed in the region of a ground conductor or a positive conductor of a motor vehicle battery.

18. The device according to claim 10, wherein the sensor is disposed in the region of an electrical consumer or a group of electrical consumers of a motor vehicle.

19. The device according to claim 10, wherein the first section comprises a first saturation magnetization and the second section comprises a second saturation magnetization and the first saturation magnetization is different than the second saturation magnetization.

20. The device according to claim 10, wherein the first section of the magnetic circuit comprises at least two overlapping legs and forms an air gap in the region of the overlapping legs.

21. The device according to claim 20, wherein the legs are substantially arch-shaped.

22. The device according to claim 10, wherein the second section comprises a rectangular ferrite core frame having a control winding on at least one side.

23. The device according to claim 22, wherein the ferrite core frame comprises a control winding on each long side of the rectangular ferrite core frame.

24. The device according to claim 22, wherein the first section is connected in a middle region of a short side of the rectangular ferrite core frame.

25. The device according to claim 10, in combination with a motor vehicle, wherein the device monitors currents in an electrical system of the motor vehicle.

* * * * *